United States Patent
Chung

(10) Patent No.: US 9,048,109 B2
(45) Date of Patent: Jun. 2, 2015

(54) SEMICONDUCTOR DEVICE, MODULE AND SYSTEM EACH INCLUDING THE SAME, AND METHOD FOR MANUFACTURING THE SEMICONDUCTOR DEVICE

(71) Applicant: SK Hynix Inc., Icheon (KR)

(72) Inventor: In Seung Chung, Seoul (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 13/719,037

(22) Filed: Dec. 18, 2012

(65) Prior Publication Data

US 2013/0256785 A1 Oct. 3, 2013

(30) Foreign Application Priority Data

Mar. 27, 2012 (KR) ........................ 10-2012-0031096

(51) Int. Cl.
*H01L 29/06* (2006.01)
*H01L 29/423* (2006.01)
*H01L 27/108* (2006.01)
*H01L 21/768* (2006.01)

(52) U.S. Cl.
CPC ........ *H01L 29/0649* (2013.01); *H01L 29/0653* (2013.01); *H01L 29/0642* (2013.01); *H01L 29/0603* (2013.01); *H01L 29/4236* (2013.01); *H01L 29/42364* (2013.01); *H01L 27/10855* (2013.01); *H01L 27/10885* (2013.01); *H01L 27/10888* (2013.01); *H01L 21/76897* (2013.01)

(58) Field of Classification Search
CPC .............................. H01L 27/108; H01L 28/40
USPC ......... 257/296, 306, 307, 308, 532, 535, 773, 257/774, E27.084, E27.086, E27.088, 257/E27.091, E27.094
See application file for complete search history.

(56) References Cited

U.S. PATENT DOCUMENTS

| 7,772,631 | B2* | 8/2010 | Schloesser | 257/296 |
| 8,293,644 | B2* | 10/2012 | Jang et al. | 438/675 |
| 8,330,197 | B2* | 12/2012 | Park | 257/296 |
| 2004/0075156 | A1* | 4/2004 | Lee et al. | 257/503 |
| 2013/0009226 | A1* | 1/2013 | Park et al. | 257/296 |

FOREIGN PATENT DOCUMENTS

| KR | 10-2008-0084064 A | 9/2008 |
| KR | 10-2011-0001189 A | 1/2011 |

* cited by examiner

*Primary Examiner* — Eduardo A Rodela

(57) ABSTRACT

A barrier for preventing a bridge between adjacent storage node contacts is formed below a bit line located between the bit line contacts, so that a contact region between each storage node contact and an active region is increased in size. The semiconductor device includes a device isolation film defining an active region, a bit line contact coupling the active region to a bit line, and a barrier formed below the bit line located between the bit line contacts.

20 Claims, 13 Drawing Sheets

SEMICONDUCTOR DEVICE, MODULE AND SYSTEM EACH INCLUDING THE SAME, AND METHOD FOR MANUFACTURING THE SEMICONDUCTOR DEVICE

CROSS-REFERENCE TO RELATED APPLICATION

The priority of Korean patent application No. 10-2012-0031096 filed on 27 Mar. 2012, the disclosure of which is hereby incorporated in its entirety by reference, is claimed.

BACKGROUND OF THE INVENTION

Embodiments of the present invention relate to a semiconductor device including a buried bit line, and more particularly to a semiconductor device for preventing a bridge between contiguous storage node contacts (SNCs) and a method for manufacturing the same.

Although the demand of implementing a high-capacity dynamic random access memory (DRAM) is rapidly increasing, simply increasing chip size to accommodate additional memory has limitations.

The larger the chip size, the less the number of chips on each wafer, resulting in a reduction of productivity. Therefore, in recent times, many people and developers are conducting intensive research into a method for reducing a cell region by varying a cell layout to form a large number of memory cells on one wafer. By such efforts, a semiconductor layout is rapidly changing from an $8F^2$ structure to a $6F^2$ structure.

However, the $6F^2$ structure uses a storage node contact (SNC) space that is smaller than the $8F^2$ structure. Therefore, in order to form the $6F^2$ layout, a storage node contact (SNC) hole is formed and a lateral surface of a lower part of the SNC hole is additionally etched, so that a contact region between a storage node and an active region is increased in size.

However, when an insulation film located at a lower part of a bit line is excessively etched during the above additional etching process, a bridge may unexpectedly occur between SNCs to be formed in a subsequent process.

BRIEF SUMMARY OF THE INVENTION

Various embodiments of the present invention are directed to providing a semiconductor device, a module and a system each including the same, and a method for manufacturing a semiconductor device that substantially obviates one or more problems due to limitations and disadvantages of the related art.

An embodiment of the present invention relates to a technology that prevents a bridge from occurring between storage node contacts (SNCs) by improving a structure of a semiconductor device.

In accordance with an aspect of the present invention, a semiconductor device includes: a device isolation film for defining an active region; a bit line contact for coupling the active region to a bit line; and a barrier formed below the bit line located between the bit line contacts.

The semiconductor device may further include: a contact spacer formed to enclose the bit line contact.

The barrier may be formed as a line type configured to interconnect the contact spacers.

The barrier may be formed to have a smaller critical dimension (CD) than the bit line.

The barrier may be formed of the same material as the contact spacer.

The barrier may include a nitride film.

The barrier may be formed by the same fabrication process as the contact spacer.

The semiconductor may further include: an interlayer insulation film formed between the bit line contacts or below the bit line so as to electrically insulate the bit line contacts, wherein the barrier includes a material having an etch selectivity ratio lower than that of the interlayer insulation film.

The active region may be formed to obliquely cross the bit line.

The semiconductor device may further include: a gate formed perpendicular to the bit line, and buried in the active region and the device isolation film.

In accordance with another aspect of the present invention, a semiconductor device includes: a device isolation film for defining an active region; an interlayer insulation film formed over the active region and the device isolation film; a bit line contact formed in the interlayer insulation film and formed to interconnect the active region and the bit line; a storage node contact for coupling the active region to a storage node; and a barrier formed below the bit line located between the storage node contacts.

The barrier may be formed as a line type configured to interconnect the bit line contacts.

The barrier may be formed to have a smaller critical dimension (CD) than the bit line.

The barrier may have a lower etch selectivity ratio than the interlayer insulation film.

A lower part of the storage node contact may be larger in width than an upper part of the storage node contact.

In accordance with another aspect of the present invention, a method for forming a semiconductor device includes: forming a device isolation film defining an active region; forming a first interlayer insulation film over the active region and the device isolation film;

etching the first interlayer insulation film, thereby forming bit line contact holes and a trench for interconnecting the bit line contact holes; forming a barrier in the trench; forming a bit line contact in the bit line contact hole; and forming a bit line over the bit line contact and the barrier.

In accordance with another aspect of the present invention, a semiconductor module including a plurality of semiconductor devices mounted to a substrate includes: each of the semiconductor devices including: a device isolation film formed to define an active region; one or more bit line contacts formed to interconnect the active region and a bit line; and a barrier formed below the bit line located between the bit line contacts.

In accordance with another aspect of the present invention, a semiconductor system which includes not only a semiconductor module having a plurality of semiconductor devices mounted to a substrate but also a controller for controlling the semiconductor module includes: each of the semiconductor devices including: a device isolation film formed to define an active region; one or more bit line contacts formed to interconnect the active region and a bit line; and a barrier formed below the bit line located between the bit line contacts.

In accordance with another aspect of the present invention, a computer system which includes not only a semiconductor system having at least one semiconductor module but also a controller for processing data stored in the semiconductor system, the computer system includes: the semiconductor module including a plurality of semiconductor devices mounted to a substrate, wherein the semiconductor device includes: a device isolation film formed to define an active region; one or more bit line contacts formed to interconnect the active region and a bit line; and a barrier formed below the bit line located between the bit line contacts.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or similar parts.

Figure 1:
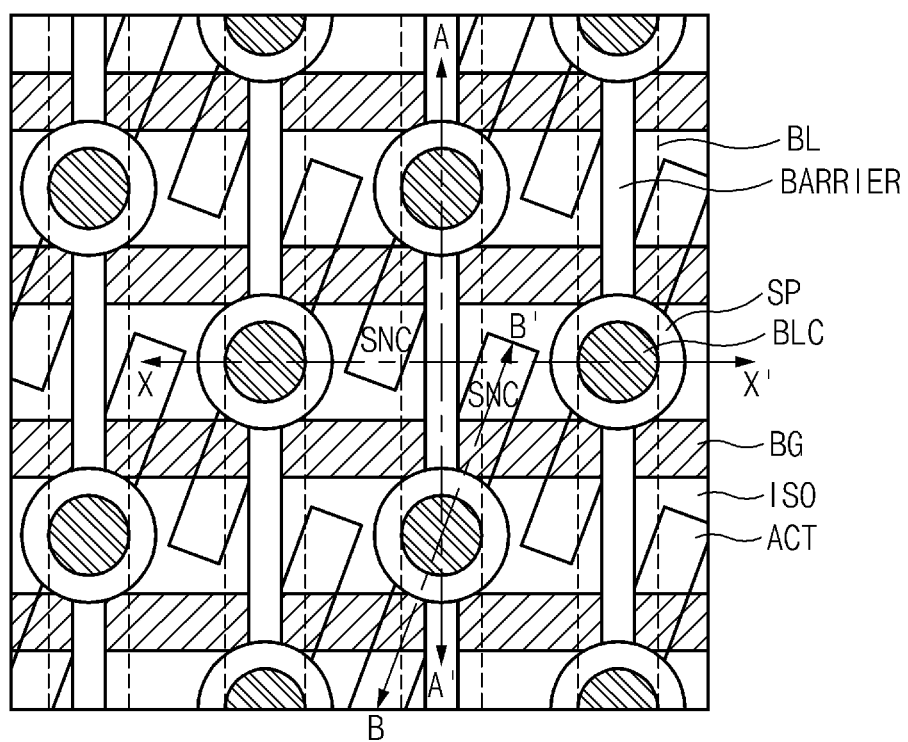
FIG. 1 is a plan view illustrating a semiconductor device according to an embodiment of the present invention.

FIG. 1 is a plan view illustrating a 6F2 structure applied to a semiconductor device according to an embodiment of the present invention. FIG. 2 is a cross-sectional view illustrating the 6F2-type semiconductor device taken along the line X-X' of FIG. 1, FIG. 2b is a cross-sectional view illustrating a semiconductor device taken along the line A-A' of FIG. 1, and FIG. 2c is a cross-sectional view illustrating a semiconductor device taken along the line B-B' of FIG. 1.

Referring to FIGS. 1 and 2a to 2c, a bit line (BL) denoted by a dotted line is formed perpendicular to a buried gate (BG). An island-type active region defined by a device isolation structure (ISO) is formed to be tilted with respect to the bit line (BL) and the buried gate (BG).

A bit line contact (BLC) for coupling the active region (ACT) to the bit line (BL) is formed at the center part of the active region (ACT) where the active region (ACT) and the bit line (BL) overlap. A contact spacer (SP) is formed over a lateral surface, or sidewall, of the bit line contact (BLC). The contact spacer (SP) is formed to prevent a bridge, or short circuit, from occurring between the bit line contact (BLC) and the storage node contact (SNC), and may be formed of a nitride film. A storage node contact (SNC) for coupling the active region (ACT) to a storage node (not shown) is formed at both ends of the active region (ACT). The bit line contact (BLC) and the storage node contact (SNC) may be formed of polysilicon.

Figure 2A:
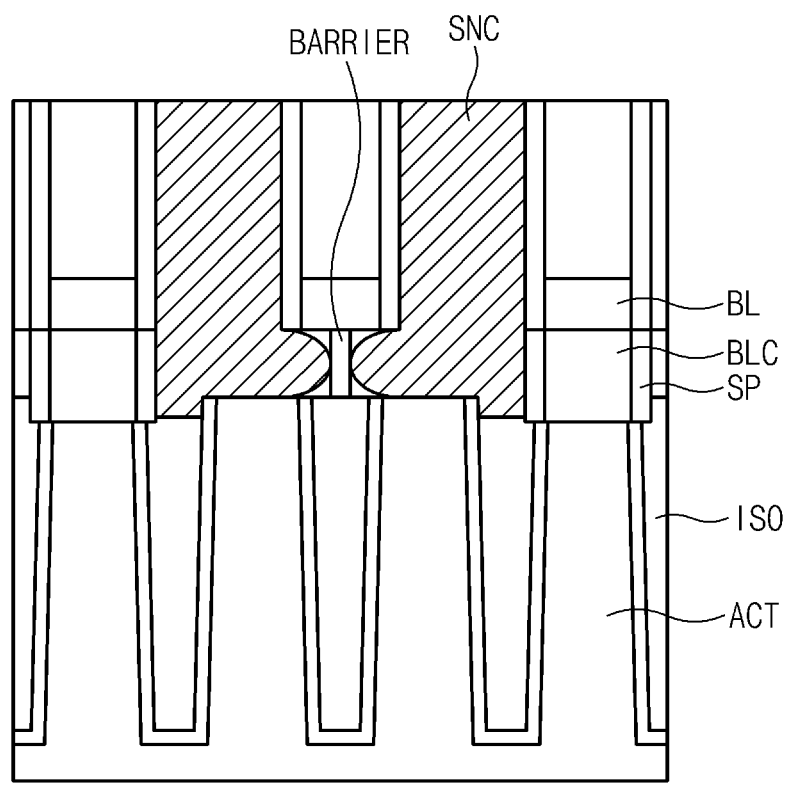
FIG. 2a is a cross-sectional view illustrating a semiconductor device taken along the line X-X' of FIG. 1.
Figure 2B:
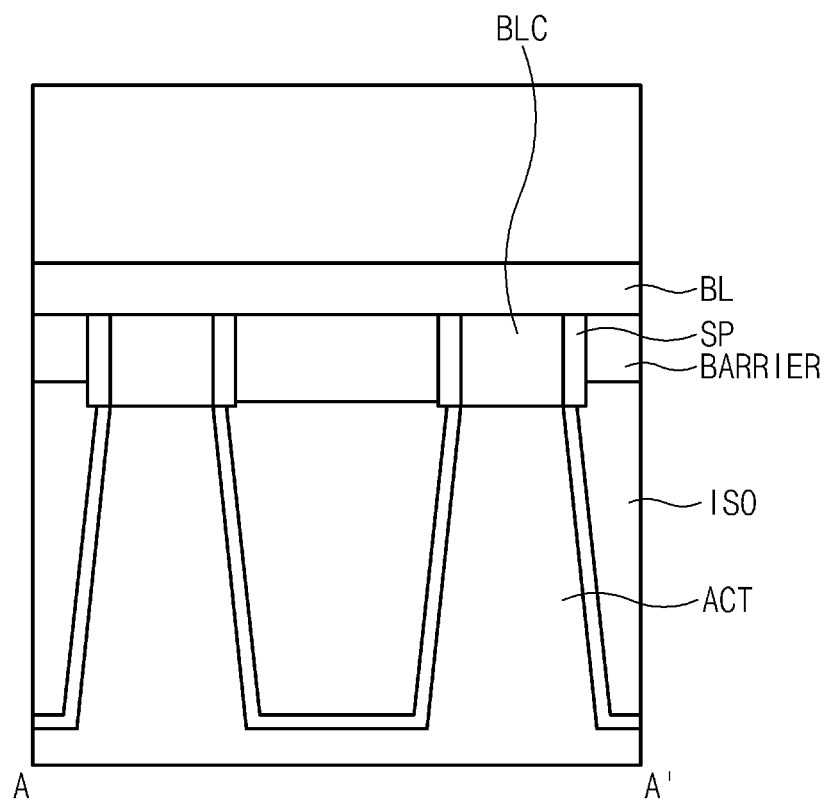
FIG. 2b is a cross-sectional view illustrating a semiconductor device taken along the line A-A' of FIG. 1.
Figure 2C:
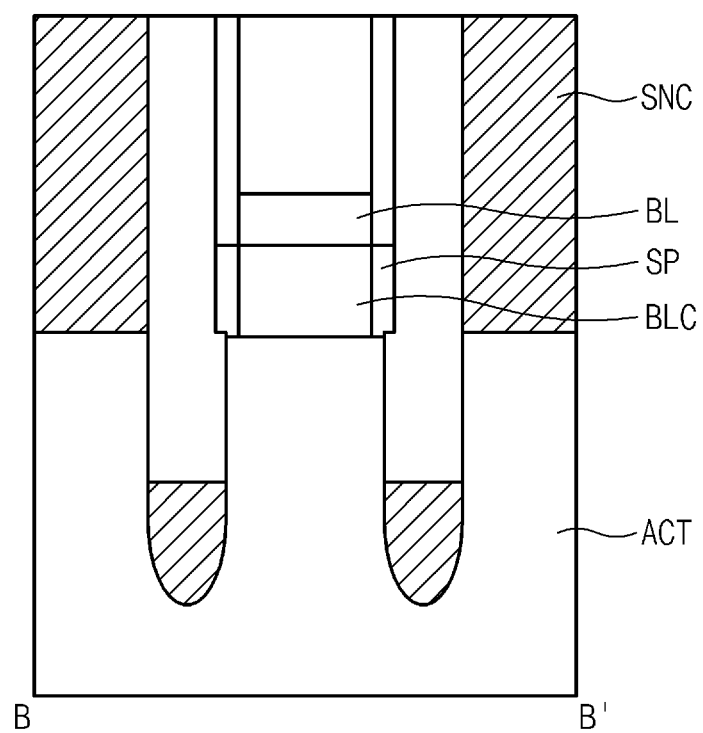
FIG. 2c is a cross-sectional view illustrating a semiconductor device taken along the line B-B' of FIG. 1.

As seen in FIGS. 2a and 2b, a barrier preventing a bridge between the storage node contacts (SNCs) is formed at a lower part of the bit line (BL) between neighboring bit line contacts (BLCs). The barrier is arranged along the bit line (BL) and is formed as a line type in such a manner that the barrier has a width that is less than a width of the bit line (BL). In more detail, the width of the barrier is less than the width of a bit line (BL), but is sufficient to prevent a bridge from occurring between adjacent storage node contacts (SNCs) while providing a sufficiently sized contact region between the active region (ACT) and the storage node contact (SNC). The adjacent storage node contacts (SNCs) may be disposed on both sides of a bit line (BL), such as the contacts marked as "SNC" in FIG. 1 and the contacts separated by the barrier in FIG. 2. The barrier may be formed simultaneously with the contact spacer (SP).

As seen in FIG. 2b, which shows a cross-section taken along line A-A' of FIG. 1, first and second bit line contacts (BLC) are separated from one another by spacers disposed over the bit line contacts (BLC) and a barrier. The barrier runs along the bit line (BL). FIG. 2c shows a cross-section taken along B-B' of FIG. 1, which runs along an active region (ACT) that is coupled to a bit line contact (BLC). As seen in FIG. 2c, a bit line contact (BLC) is coupled to a central portion of an active region (ACT), while storage node contacts (SNC) are coupled to the active region (ACT) on both sides of the bit line contact (BLC).

FIGS. 3A to 3E are cross-sectional views illustrating a method for sequentially forming the semiconductor device of FIGS. 1 and 2a to 2c according to an embodiment of the present invention.

Figure 3A:
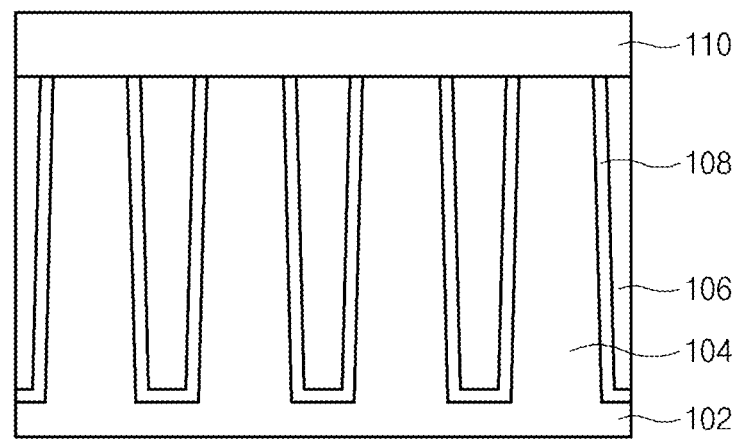
FIGS. 3A to 3E are cross-sectional views illustrating a method for sequentially forming the semiconductor device of FIGS. 1 and 2a to 2c.

Referring to FIG. 3A, a pad oxide film (not shown) and a pad nitride film (not shown) are sequentially deposited over the semiconductor substrate 102, and a device isolation film (ISO) 106 defining an active region 104 is formed through a shallow trench isolation (STI) process.

For example, a trench (not shown) for forming a device isolation film (ISO) defining the active region 104 may be formed in the semiconductor substrate 102 through an etching process based on an STI mask. Subsequently, after an insulation film is formed in the trench, the insulation film is CMP (Chemical Mechanical Polishing) processed until the pad nitride film is exposed, so that a device isolation film (ISO) 106 is formed.

The device isolation film (ISO) 106 may be formed by a single gapfilling process using a flowable oxide film. Alternatively, the device isolation film (ISO) 106 may be formed of a combination (for example, a laminate) of the flowable oxide film and the deposition oxide film. In such an embodiment, the flowable oxide film may include a spin on dielectric (SOD), and the deposition oxide film may include a high density plasma (HDP) oxide film. Before forming the device isolation film (ISO) 106, an oxide film 108 may be formed over an inner surface of the trench through a surface oxidation process, and a liner nitride film (not shown) may be formed over oxide film 108. As shown in the figures, the oxide film may be formed over all exposed surfaces of the isolation trench.

A semiconductor substrate over which the device isolation film 106 is formed is etched so that a trench (not shown) for forming a buried gate (not shown) is formed. The trench may be formed by etching the active region 104 and the device isolation film 106. In an embodiment, the gate may be formed in a line shape, by simultaneously etching the active region 104 and the device isolation film 106 to form a linear trench. In an embodiment, the device isolation film 106 is etched more deeply than the active region based on differences in etch selectivity ratios, and the active region 104 may be formed as a fin structure in which the active region 104 protrudes from the device isolation film 106 in the trench.

Subsequently, after an oxide film (not shown) is formed over an inner surface of the trench through an oxidation process, a metal film (not shown) for a gate is formed in the trench. In an embodiment, the metal film for the gate may include one or more of titanium nitride (TiN), tantalum nitride (TaN), tungsten (W), and similar materials. For example, after a thin TiN film (or a TaN film) is conformally deposited over a sidewall of the trench to reduce resistance, a tungsten (W) material may be deposited to form a metal film serving as a gate. Alternatively, the TiN film and the TaN film may be deposited to form the metal film for the gate, or the TiN film, the TaN film, and the W film may be sequentially deposited to form the metal film for the gate.

Subsequently, the metal film for the gate is etched back and cleaned, such that a buried gate (BG of FIG. 1) is formed. Subsequently, a sealing film (not shown) is formed to seal the top part of the buried gate (BG). In an embodiment, the sealing film may be formed of a nitride film.

Thereafter, an interlayer insulation film 110 is formed over the active region 104 including the buried gate (BG) and the device isolation film 106. In an embodiment, the interlayer insulation film 110 may be formed of an oxide film.

Figure 3B:
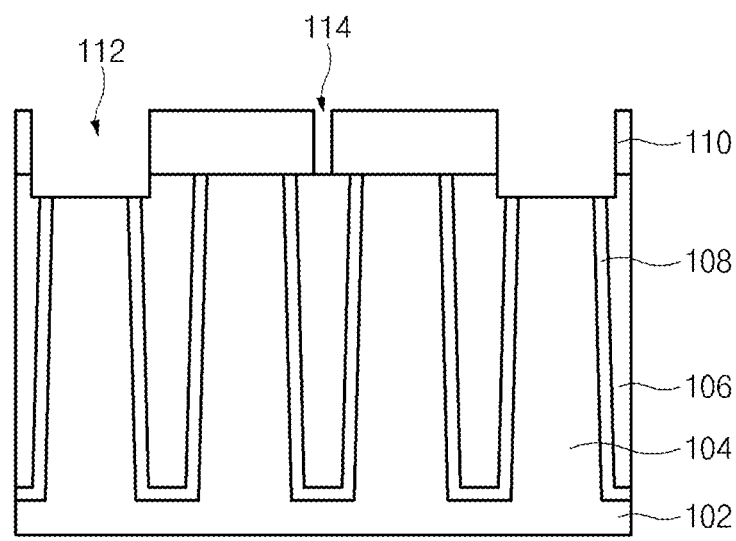

Referring to FIG. 3B, the interlayer insulation film 110, the active region 104 and the device isolation film 106 are etched using a mask that defines a bit line contact region and a barrier region, such that a trench 114 connecting bit line contact holes 112. In other words, trench 114 is formed in a line so that it runs through, or connects, a plurality of contact holes 112. As a result, subsequently formed barrier 118 is arranged in a line between contact spacers 116. In an embodiment, the trench 114 may be formed as a reserved barrier region in which a barrier is to be formed in a subsequent process, and the trench 114 may have a width that is less than the width of the bit line (BL).

Figure 3C:
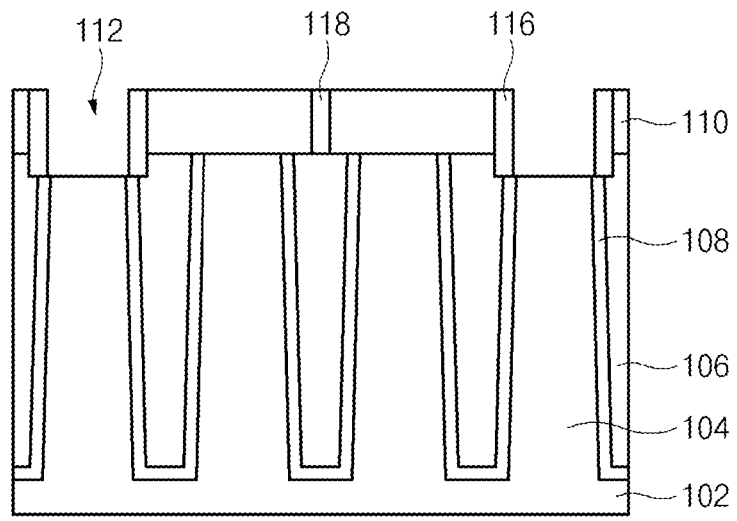

Referring to FIG. 3C, a contact spacer 116 is formed over a sidewall of the bit line contact hole 112, and a barrier 118 is formed in the trench 114.

For example, an insulation film (not shown) for a spacer may be deposited over the entire surface of the structure of FIG. 3B and etched back, such that the insulation film serving as a spacer is removed from an upper surface of the interlayer insulation film 100 and from a lower surface of the bit line contact hole 112. As a result, the contact spacer 116 is formed over a sidewall of the bit line contact hole 112. In an embodiment, the trench 114 is formed to have a narrow width, so that it is completely filled with the insulation film for spacer. During the etchback process, the filled insulation film for spacer is not removed, such that barrier 118 is formed.

Figure 3D:
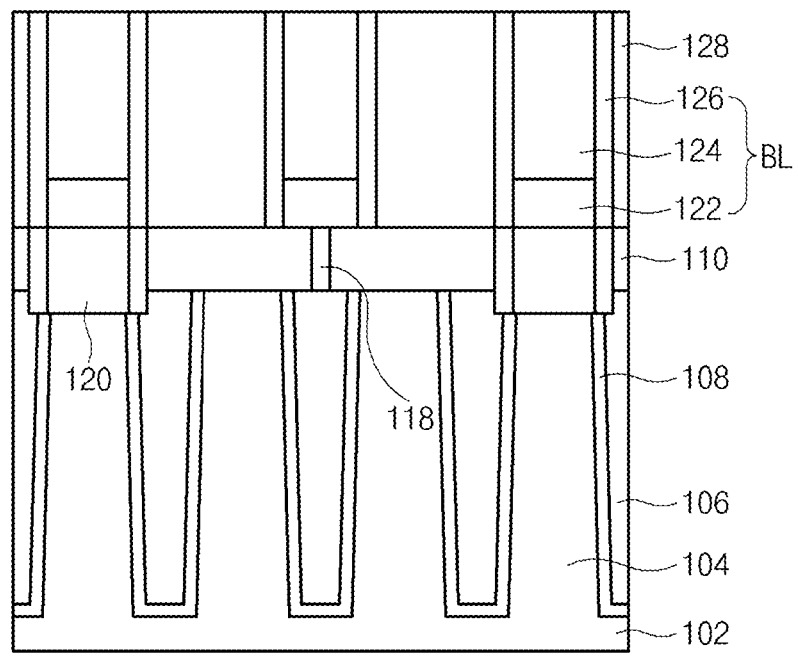

Referring to FIG. 3D, a bit line contact material layer (not shown) is formed to fill the bit line contact hole 112. In an embodiment, the bit line contact material layer may be formed of polysilicon. Subsequently, the bit line contact material layer is etched back or CMP-processed to expose the interlayer insulation film 110, so that a bit line contact 120 is formed. When removing the bit line contact material layer, the gate is protected by the sealing film formed thereon so that it is not damaged. In the resulting structure, the contact spacer 116 is disposed over sidewalls of bit line contact 120.

Subsequently, a bit line conductive film (not shown) and a hard mask layer (not shown) are sequentially deposited over the bit line contact 120 and the interlayer insulation film 110. The hard mask layer is etched using a mask defining a bit line region, so that a hard mask layer pattern 124 is formed. The bit line conducive film is etched using the hard mask layer pattern 124 as a mask, so that a bit line pattern 122 is formed. Subsequently, bit line spacer 126 is formed over sidewalls of the bit line pattern 122 and the hard mask layer pattern 124, so that a bit line (BL) is formed.

In an embodiment, the bit line conductive film may be formed of a laminate of the barrier metal film and tungsten (W) film, and the barrier metal film may be formed of titanium (Ti), titanium nitride (TiN), tungsten nitride (WN), tungsten silicon nitride (WSiN) or a laminate thereof. The hard mask layer may be formed of a laminate of a nitride film, an ACL (Amorphous Carbon Layer) film, and a SiON film.

After an interlayer insulation film 128 is formed over the bit line (BL) and the interlayer insulation film 110, the interlayer insulation film 128 is CMP-processed until the hard mask layer pattern 124 is exposed. In an embodiment, the interlayer insulation film 128 may be formed of the same oxide film as the interlayer insulation film 110.

Figure 3E:
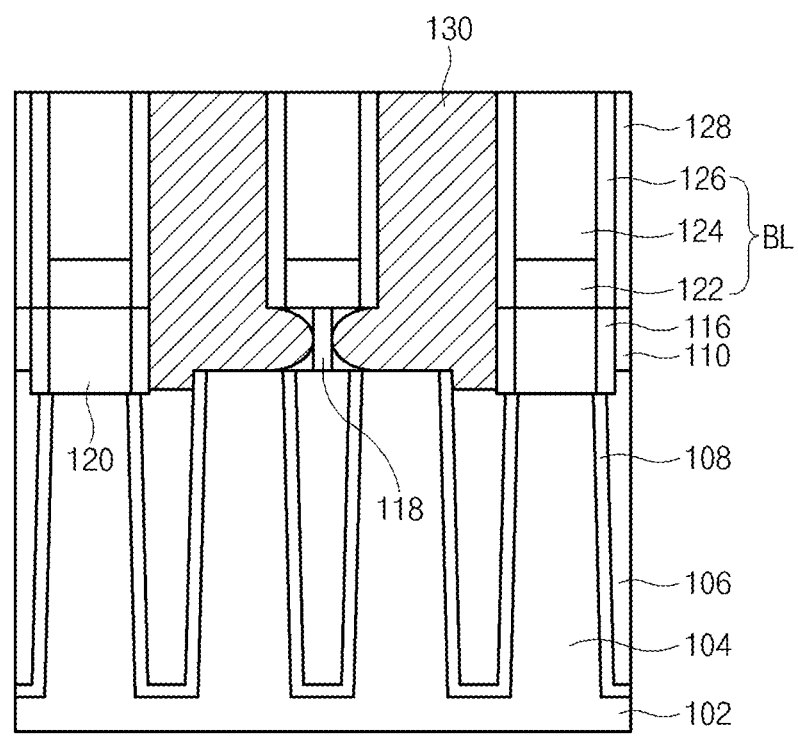

Referring to FIG. 3E, the interlayer insulation films 128 and 110 are etched using a mask defining the storage node contact (SNC) region until the active region 104 is exposed, so that a storage node contact hole (not shown) is formed.

In an embodiment, the storage node contact hole is formed between the bit lines (BLs) so that the active region formed below the bit lines (BLs) is not exposed by the storage node contact hole. In such an embodiment, a lower part of the storage node contact hole may be further etched to expose a larger active region, so that a lower part of the storage node contact hole can be enlarged. To facilitate this embodiment, the interlayer insulation film 110 may have a higher etch selectivity ratio than each of the device isolation film 106 and the contact spacer 116, so that the volume of the device isolation film 106 and the contact spacer 116 that is etched can be minimized while the volume of interlayer insulation film 110 is maximized. Accordingly, the interlayer insulation film 110 formed below the bit line BL may be additionally etched so that a lower part of the storage node contact hole is increased in width and the active region 104 is more exposed.

In a conventional process, if the interlayer insulation film 110 formed below the bit line BL is excessively etched by such an etch process, storage node contacts (SNCs) formed in a subsequent process by simultaneous etching of adjacent storage node contact holes may result in an electrical bridge between the storage node contacts. In an embodiment of the present invention, a barrier 118 is formed below the bit line (BL), and the barrier 118 prevents a bridge from being created when forming the neighboring storage node contact holes. The barrier 118 electrically insulates adjacent storage node contacts (SNCs) from one another, and serves as an etch stop barrier when etching lower portions of storage node contact holes.

Thereafter, a storage node contact material layer (not shown) is formed in the storage node contact holes. In an embodiment, the storage node contact material layer may include polysilicon. Subsequently, the storage node contact (SNC) material layer is CMP-processed so that a storage node contact 130 is formed.

Figure 4:
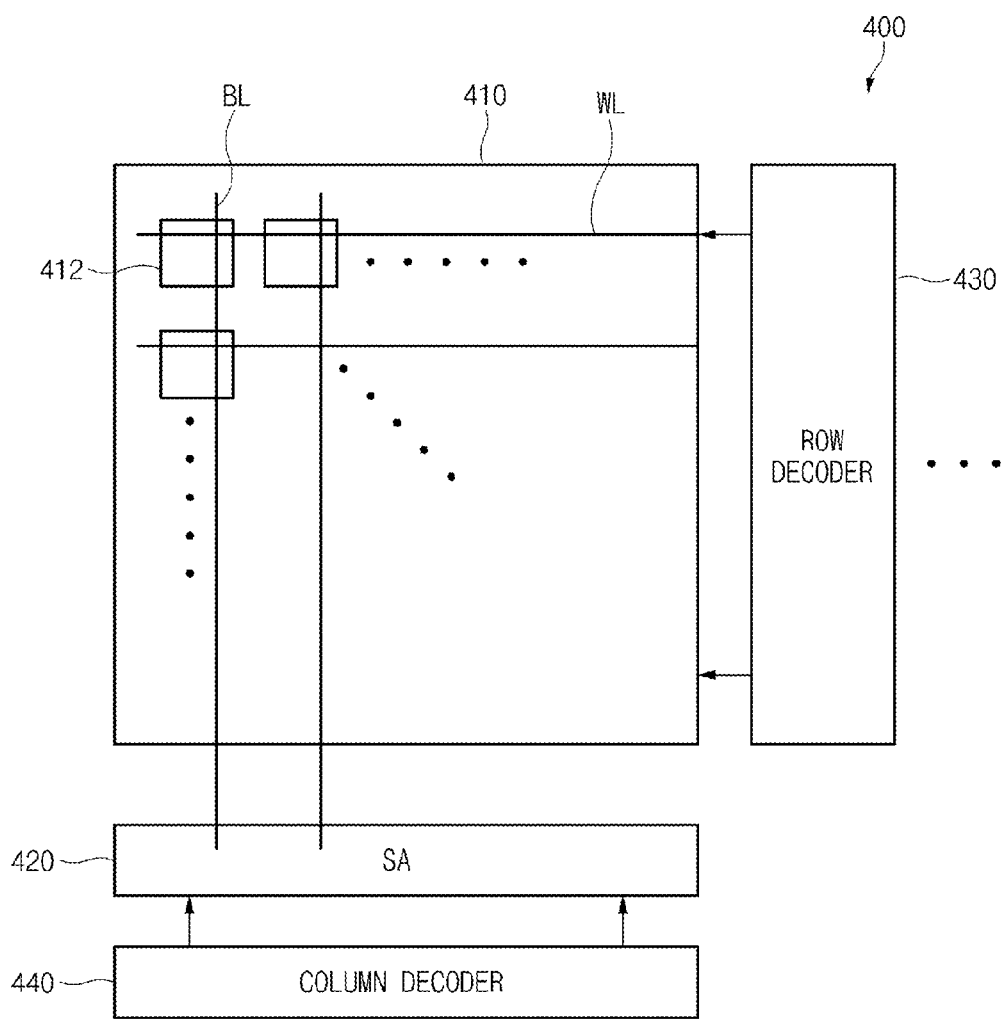
FIG. 4 is a circuit diagram illustrating the semiconductor device of FIGS. 1 and 2a to 2c extended to a core region.

FIG. 4 is a circuit diagram illustrating the semiconductor device of FIGS. 1 and 2 extended to a core region.

Referring to FIG. 4, a semiconductor device 400 includes a cell array 410, a sense-amp 420, a column decoder 430, and a row decoder 440.

The cell array 410 is arranged in such a manner that a plurality of $6F^2$-shaped memory cells 412 shown in FIG. 1 are connected to a word line WL and a bit line BL. In an embodiment, the cell array 410 includes a barrier 118. The barrier 118 is formed below the bit line BL located between bit line contacts (SNCs) and prevents a bridge from occurring between SNCs.

The sense-amp 420 is coupled to the bit line BL so that it can sense and amplify data stored in the memory cell 412 of the cell array 410.

The row decoder 430 generates a word line selection signal for selecting a memory cell 412 to be used for read/write operations of data, and applies the word line selection signal to the word line WL.

The column decoder 440 generates a drive signal for operating the sens-amp 420 coupled to the cell 412 selected by the row decoder 430, and outputs the drive signal to the sense-amp 420.

The sense-amp 420 and the decoders (430, 440) may be conventional components, and as such a detailed structure and operations thereof will herein be omitted for convenience of description.

The principal products which may include the aforementioned semiconductor device may be not only a variety of computing memories that is applicable to a desktop computer, a laptop computer, or a server, but also various graphic memories and mobile memories.

Figure 5:
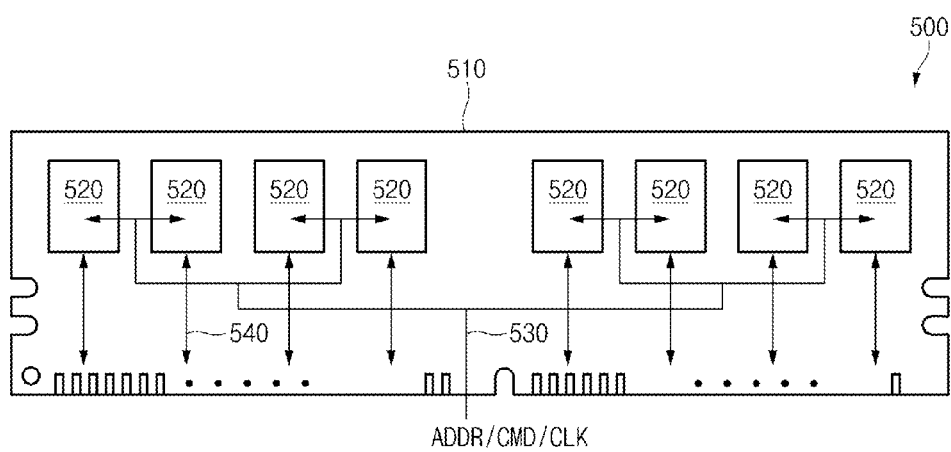
FIG. 5 is a circuit diagram illustrating a semiconductor module according to an embodiment of the present invention.

FIG. 5 is a circuit diagram illustrating a semiconductor module according to an embodiment of the present invention.

Referring to FIG. 5, a semiconductor module 500 includes a plurality of semiconductor elements 520 mounted to a module substrate 510, a command link 530 for enabling each semiconductor device 520 to receive control signals (for example, an address signal ADDR, a command signal CMD, and a clock signal CLK) from an external controller (not shown), and a data link 540 coupled to each semiconductor device 520 to transmit input/output (I/O) data.

In an embodiment, the semiconductor device 520 may include a plurality of semiconductor devices 400 shown in FIG. 4. The command link 530 and the data link 540 may be identical or similar to those of a general semiconductor module.

Although 8 semiconductor devices 520 may be mounted to the front surface of the module substrate 510 as shown in FIG. 5, it should be noted that the semiconductor devices 520 may also be mounted to the back surface of the module substrate 510. That is, the semiconductor devices 520 may be mounted to one side or both sides of the module substrate 510, and the number of mounted semiconductor devices 520 is not limited only to the example of FIG. 5. In addition, a material and structure of the module substrate 510 are not specially limited.

Figure 6:
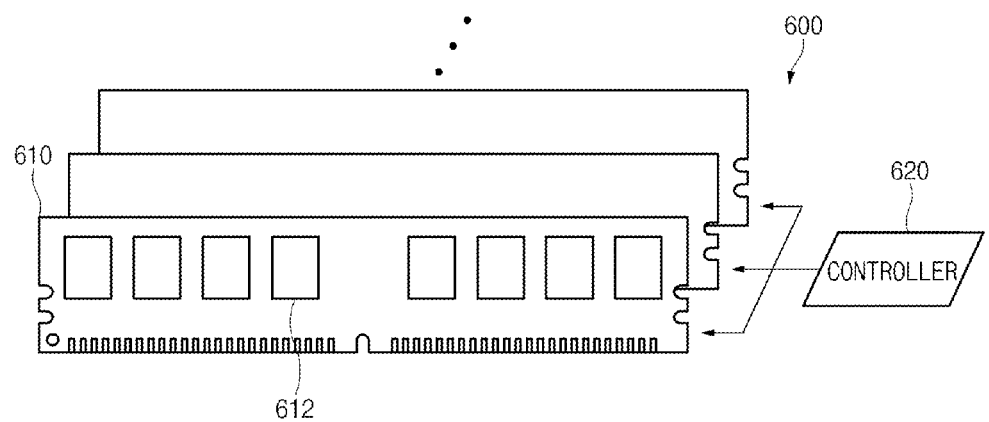
FIG. 6 is a circuit diagram illustrating a semiconductor system according to an embodiment of the present invention.

FIG. 6 is a circuit diagram illustrating a semiconductor system according to an embodiment of the present invention.

Referring to FIG. 6, the semiconductor system 600 includes at least one semiconductor module 610 including a plurality of semiconductor devices 612 and a controller 620 for controlling the operations of the semiconductor module 610 by providing a bidirectional interface between the semiconductor module 610 and an external system (not shown).

The controller 620 may be functionally identical or similar to a controller for controlling the operations of a plurality of semiconductor modules of a general data processing system, and as such a detailed description thereof will herein be omitted for convenience of description and better understanding of the present invention.

The semiconductor module 610 may be the semiconductor module 500 shown in FIG. 5.

Figure 7:
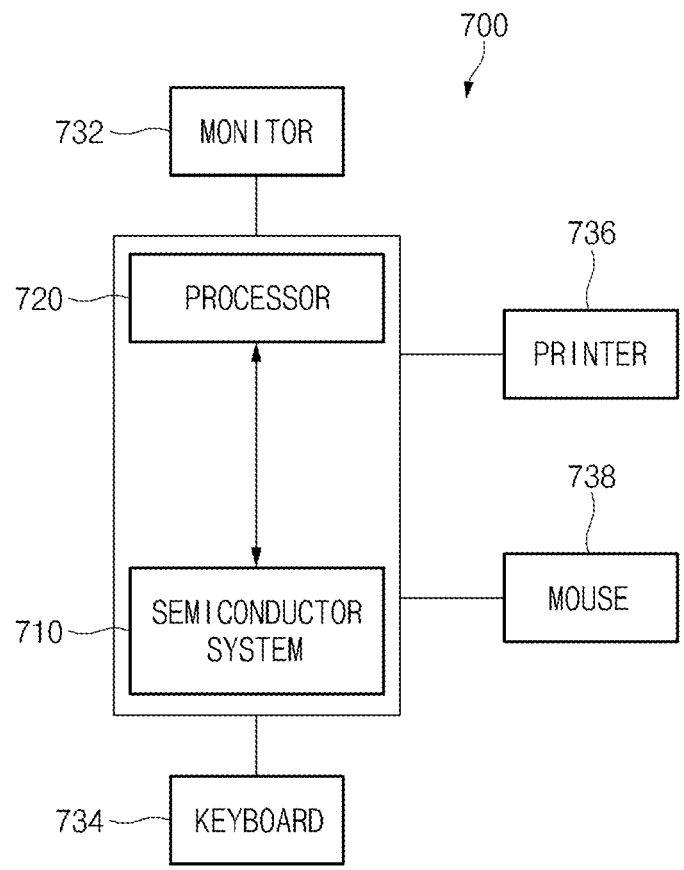
FIG. 7 is a block diagram illustrating a computer system according to an embodiment of the present invention.

FIG. 7 is a block diagram illustrating a computer system according to an embodiment of the present invention.

Referring to FIG. 7, the computer system 700 includes a semiconductor system 710 and a central processing unit (CPU) 720. The semiconductor system 710 stores data needed for controlling the computer system 700. In this case, the semiconductor system 710 may be set to the semiconductor system 600 shown in FIG. 6.

The processor 720 controls the computer system 700 by processing data stored in the semiconductor system 710. The processor 720 may be functionally identical or similar to the CPU of a general computer system.

The computer system 700 may include a variety of user interface (UI) devices, for example, a monitor 732, a keyboard 734, a printer 736, a mouse 738, etc.

Figure 8:
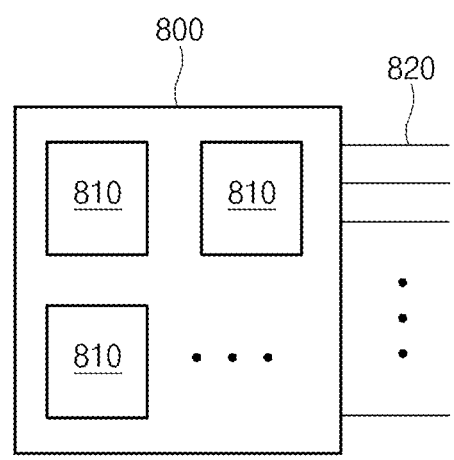
FIG. 8 is a diagram illustrating a circuit module according to an embodiment of the present invention.

FIG. 8 is a diagram illustrating a data processing system according to an embodiment of the present invention.

Referring to FIG. 8, a data processing system 800 is mounted to an electronic system (not shown) so that it can perform a specific function from among a plurality of functions of the electronic system.

The data processing system 800 includes at least one semiconductor device 810 mounted to the substrate.

The semiconductor device 810 includes a cell array (not shown) for storing data needed for performing a specific function of the electronic system, and a processor (not shown) for performing the corresponding specific function by processing data stored in the cell array. That is, the semiconductor device 810 includes a unit for storing data in a single unit element (die or chip) and a unit for performing a specific function by processing the stored data. In an embodiment, the cell array may be configured in such a manner that a plurality of $6F^2$-shaped memory cells 412 are coupled to the word line WL and the bit line BL as shown in FIG. 1. In addition, the cell array 410 includes a barrier 118 that is formed below the bit line BL located between bit line contacts (SNCs) so as to prevent a bridge from occurring between the SNCs.

The data processing system 800 is coupled to other constituent elements (for example, CPUs) of the electronic system through leads 820, such that it can unidirectionally or bidirectionally transmit/receive data and control signals to/from the coupled constituent elements.

Figure 9:
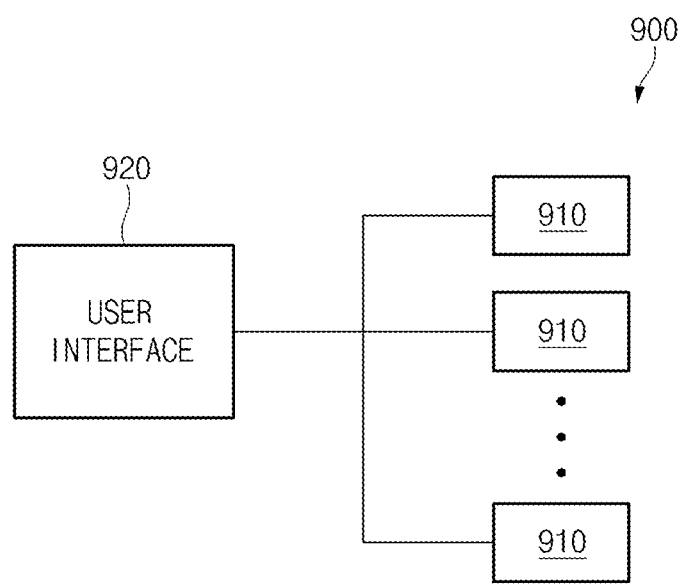
FIG. 9 is a block diagram illustrating an electronic device according to an embodiment of the present invention.

FIG. 9 is a block diagram illustrating an electronic device according to an embodiment of the present invention.

Referring to FIG. 9, the electronic system 900 includes at least one data processing system 910 and a user interface 920.

The data processing system 910 performs a specific function from among a plurality of functions of the electronic system 900, and includes at least one semiconductor substrate mounted to the substrate. The semiconductor device includes a cell array (not shown) for storing data needed for performing a specific function of the electronic system 900, and a processor (not shown) for controlling the corresponding function by processing the data stored in the cell array. In an embodiment, the cell array may be configured in such a manner that a plurality of $6F^2$-shaped memory cells 412 is coupled to the word line WL and the bit line BL as shown in FIG. 1. In addition, the cell array 410 includes a barrier 118 that is formed below the bit line BL located between SNCs to prevent a bridge from occurring between the SNCs.

The user interface (UI) 920 provides an interface between a user and a circuit module 910. The user interface 920 may include a keypad, a touchscreen, a speaker, etc. incorporated into the electronic device.

The electronic device 900 may include a variety of embedded systems included in various electronic, information, and communication devices, for example, computers, household appliances, factory automation systems, elevators, mobile phones, etc.

As is apparent from the above description, according to the embodiments of the present invention, a contact region between a storage node contact (SNC) and an active region is increased in size, and a bridge is prevented from occurring between contiguous storage node contacts (SNCs).

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an exemplary embodiment of the present invention or included as a new claim by a subsequent amendment after the application is filed.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or a non-volatile memory device. Other additions, subtractions, or modifications are obvious in view of the present disclosure and are intended to fall within the scope of the appended claims.

What is claimed is:

1. A semiconductor device comprising:
   a device isolation film defining a first active region and a second active region;
   a first bit line contact coupling the first active region to a bit line;
   a second bit line contact coupling the second active region to the bit line;
   a first storage node contact coupling the first active region to a first storage node;
   a second storage node contact coupling the second active region to a second storage node;
   a barrier formed below the bit line and isolating the first storage node contact from the second storage node contact; and
   a gate that crosses the barrier,
   wherein the first active region neighbors the second active region in a bit line direction.

2. The semiconductor device according to claim 1, further comprising:
   a contact spacer disposed over sidewalls of the bit line contact.

3. The semiconductor device according to claim 2, wherein the barrier is formed of the same material as the contact spacer.
   a contact spacer disposed over sidewalls of the bit line contact.

4. The semiconductor device according to claim 3, wherein the barrier includes a nitride film.

5. The semiconductor device according to claim 3, wherein the barrier and the contact spacer are formed at the same time with the same process.

6. The semiconductor device according to claim 1, wherein the barrier is disposed in a shape of a line between the first and second bit line contacts.

7. The semiconductor device according to claim 6, wherein a width of the barrier is less than a width of the bit line.

8. The semiconductor device according to claim 1, further comprising:
   an interlayer insulation film formed over the first and second active regions and the device isolation film,
   wherein the barrier includes a material having an etch selectivity lower than an etch selectivity of the interlayer insulation film.

9. The semiconductor device according to claim 1, wherein the first and second active regions obliquely cross the bit line.

10. The semiconductor device according to claim 1, wherein the gate is perpendicular to the barrier.

11. The semiconductor device according to claim 1, wherein the barrier runs along the bit line.

12. A semiconductor device comprising:
    a device isolation film defining a first active region and a second active region;
    an interlayer insulation film formed over the first and second active regions and the device isolation film;
    a first storage node contact formed in the interlayer insulation film and coupled do to the first active region;
    first a second storage node contact formed in the interlayer insulation film and coupled to the second active region; and
    a barrier provided below a bit line intersecting the first active region and the second active region and between the first storage node contact and the second storage node contact; and
    a gate that crosses the barrier,
    wherein the first active region neighbors the second active region in a bit line direction.

13. The semiconductor device according to claim 12, wherein the barrier is formed in a line shape between a first bit line contact and a second bit line contact adjacent to the fist bit line contact.

14. The semiconductor device according to claim 12, wherein a width of the barrier is less than a width of a bit line.

15. The semiconductor device according to claim 12, wherein the barrier has a lower etch selectivity than the interlayer insulation film.

16. The semiconductor device according to claim 12, wherein a width of a lower part of the storage node contact is greater than a width of an upper part of the storage node contact.

17. The semiconductor device according to claim 12, wherein the barrier runs along the bit line.

18. The semiconductor device of claim 12, wherein the first and second storage node contacts extend into spaces under the bit line.

19. A semiconductor device comprising:
    a device isolation film defining a first active region and a second active region;
    an interlayer insulation film disposed over the first and second active regions and the device isolation film;
    a first bit line contact disposed in the interlayer insulation film and coupling the first active region to a bit line;
    a second bit line contact disposed in the interlayer insulation film and coupling the second active region to the bit line; and
    a barrier disposed below the bit line and having a lower etch selectivity than the interlayer insulation film; and
    a gate that crosses the barrier,
    wherein the barrier is a linear barrier extending between a first bit line contact and a second bit line contact adjacent to the first bit line contact.

20. The semiconductor device according to claim 19, wherein a width of the barrier is less than a width of the bit line.

* * * * *